United States Patent
Lee et al.

(10) Patent No.: US 7,419,844 B2
(45) Date of Patent: Sep. 2, 2008

(54) REAL-TIME CMOS IMAGER HAVING STACKED PHOTODIODES FABRICATED ON SOI WAFER

(75) Inventors: Jong-Jan Lee, Camas, WA (US); Sheng Teng Hsu, Camas, WA (US); Douglas J. Tweet, Camas, WA (US); Jer-Shen Maa, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 104 days.

(21) Appl. No.: 11/384,110

(22) Filed: Mar. 17, 2006

(65) Prior Publication Data

US 2007/0218578 A1    Sep. 20, 2007

(51) Int. Cl.
*H01L 21/00* (2006.01)
(52) U.S. Cl. .......... 438/48; 257/291; 257/292; 257/E27.133; 257/E27.134
(58) Field of Classification Search .......... 438/48; 257/291, 292, E27.133, E27.134
See application file for complete search history.

(56) References Cited

U.S. PATENT DOCUMENTS

| | | | |
|---|---|---|---|
| 3,971,065 A | 7/1976 | Bayer | |
| 5,886,374 A * | 3/1999 | Sakamoto et al. | 257/292 |
| 5,965,875 A | 10/1999 | Merrill | |
| 6,727,521 B2 | 4/2004 | Merrill | |
| 6,930,336 B1 * | 8/2005 | Merrill | 257/292 |

OTHER PUBLICATIONS

Findlater et al., *A CMOS image sensor with a double junction active pixel*, IEEE Trans. Electron Devices, vol. 50, No. 1, pp. 32-42 (2003).

* cited by examiner

*Primary Examiner*—Andy Huynh
(74) *Attorney, Agent, or Firm*—David C. Ripma

(57) ABSTRACT

A CMOS active pixel sensor includes a silicon-on-insulator substrate having a silicon substrate with an insulator layer formed thereon and a top silicon layer formed on the insulator layer. A stacked pixel sensor cell includes a bottom photodiode fabricated on the silicon substrate, for sensing light of a longest wavelength; a middle photodiode fabricated on the silicon substrate, for sensing light of a medium wavelength, which is stacked above the bottom photodiode; and a top photodiode fabricated on the top silicon layer, for sensing light of a shorter wavelength, which is stacked above the middle and bottom photodiodes. Pixel transistor sets are fabricated on the top silicon layer and are associated with each pixel sensor cell by electrical connections which extend between each of the photodiodes and respective pixel transistor(s). CMOS control circuitry is fabricated adjacent to an array of active pixel sensor cells and electrically connected thereto.

23 Claims, 12 Drawing Sheets

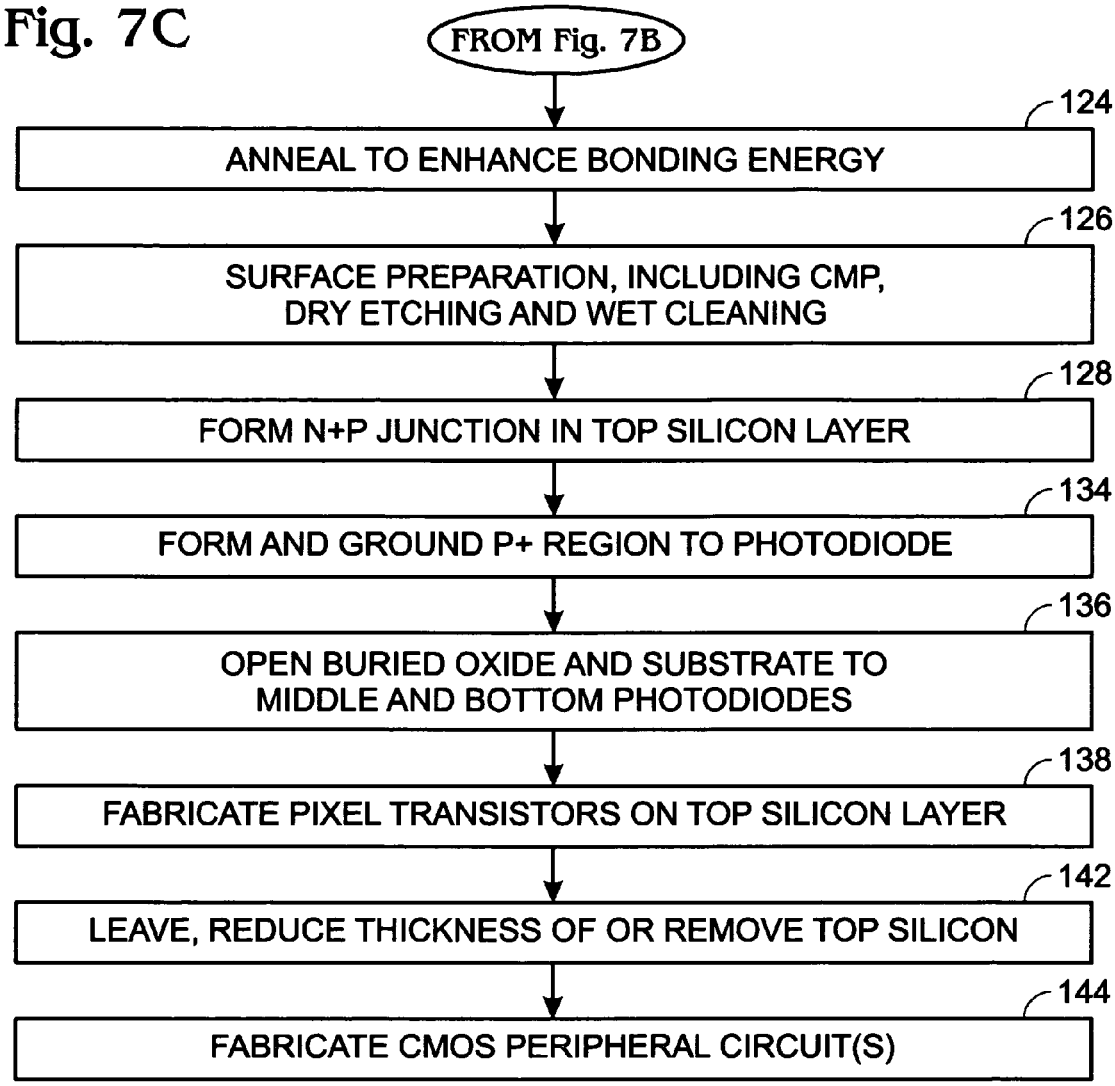
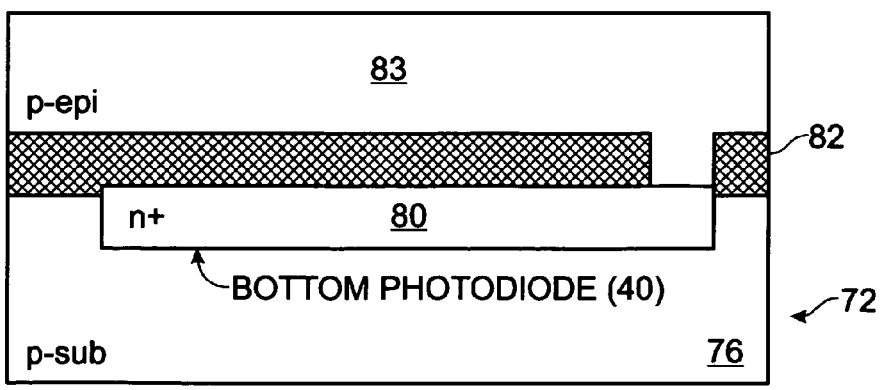

US 7,419,844 B2

REAL-TIME CMOS IMAGER HAVING STACKED PHOTODIODES FABRICATED ON SOI WAFER

FIELD OF THE INVENTION

This invention relates to imaging sensors, and specifically to a method of fabricating stacked photodiodes on silicon-on-insulator (SOI) substrates.

BACKGROUND OF THE INVENTION

Conventional CMOS and CCD digital image sensors use a photodiode, or a MOS photogate, as the photosensing element. In its native state, a photosensing element captures a light signal only as the presence or absence of light, i.e., only as white or black, respectively. In order to capture a color image, color filters are placed on top of each photo sensing element. Usually, red, green, and blue (RGB) color filters are arranged in a Bayer filter pattern. A typical Bayer filter pattern includes alternate filter placement to capture individual RGB pixels, as shown in Table 1.

TABLE 1

| R | G | R | G |
| --- | --- | --- | --- |
| G | B | G | B |
| R | G | R | G |
| G | B | G | B |

Bayer pattern capture is described in U.S. Pat. No. 3,971,065, to Bayer, granted Jul. 20, 1976, for Color Imaging Array, which provides a sensing array for color imaging, having individual luminance and chrominance sensitive elements, which are intermixed such that each type of element, i.e., according to sensitivity characteristics, occurs in a repeated pattern, with luminance elements dominating the array. Preferably, luminance elements occur at every other element position to provide a relatively high frequency sampling pattern which is uniform in two perpendicular directions, e.g., horizontal and vertical. The chrominance patterns are interlaced therewith and fill the remaining element positions to provide relatively lower frequencies of sampling. A mosaic of selectively transmissive filters is superposed in registration with a solid state imaging array having a broad range of light sensitivity, the distribution of filter types in the mosaic being in accordance with the above-described patterns.

Image-processing, following image capture by a Bayer pattern sensor, includes interpolation, during which missing data is estimated from data gathered by neighboring pixels. This results in a fuzziness in an image captured by a Bayer pattern sensor, as the image is less sharp than it otherwise would be because of under sampling. Such images also exhibit color aliasing artifacts because of lateral mis-alignment of the color filters.

A stacked RGB photodiode can directly measure red, green, and blue at the same location, by stacking three photodiodes on top of one another. This technology increases the sampling density, improves sharpness, and eliminates the color aliasing artifact. More importantly, this technology does not require color filters. An example of three-color visible-light vertical pixel sensors group is disclosed in U.S. Pat. No. 5,965,875 to Merrill, granted Oct. 12, 1999, for Color separation in an active pixel cell imaging array using a triple-well structure, which describes a structure using a triple-well CMOS process wherein the blue, green, and red sensitive PN junctions are disposed at different depths beneath the surface of the semiconductor substrate upon which the imager is fabricated, as shown in FIG. 1, as taken from '875.

Findlater et al., *A CMOS image sensor with a double junction active pixel*, IEEE Trans. Electron Devices, Vol. 50, No. 1, pp 32-42 (2003), disclose an active pixel sensor that incorporates a double-junction photodiode in conjunction with an organic filter overlay, wherein each double-junction photodiode includes top and bottom p-type layers with an n-type layer between them. The n-type layer forms the cathode of a first photodiode, the bottom p-type layer forms the anode of a second photodiode, the first photodiode is coupled to a first readout circuit, and the second photodiode is coupled to a second readout circuit. A filter mosaic overlays the sensor array.

U.S. Pat. No. 6,727,521 to Merrill, granted Apr. 27, 2004, for *Vertical color filter detector group and array*, describes the formation of the three stacked photodiodes comprising at least six layers of alternating p-type and n-typed doped regions, as shown in FIG. 2, taken from '521. PN junctions between the layers operate as photodiodes with spectral sensitivities that depend on the absorption depth versus wavelength of light in the semiconductor. Alternate layers are detector layers to collect photo-generated carriers, while the intervening layers are reference layers and are connected in common to a reference potential referred to as ground. In an embodiment where the detector layers are n-type layers, each detector group includes a blue photodetector n-type layer at the surface of the semiconductor, a green photodetector n-type layer deeper in the semiconductor, and a red photodetector n-type layer deepest in the semiconductor. Three sets of active pixel sensor circuitry are coupled to the three detector layers.

The sensor group of '521, having three stacked photodiodes with six layers of alternating p-type and n-typed doped regions, employs two silicon epitaxial processes and the three set of active pixel sensor circuitry are fabricated on the top surface of the second epitaxial layer. The isolation between the pixel transistors and the isolation between the pixel transistor and photodiode limit the area of the unit image cell. Furthermore, the processes to make an isolated, low resistance electrical contact to the red photodetector n-type layer deep in the silicon substrate are complicated and further limit the area of the unit image cell.

SUMMARY OF THE INVENTION

A CMOS active pixel sensor array includes a silicon-on-insulator substrate having a silicon substrate with an insulator layer formed thereon and a top silicon layer formed on the insulator layer. The array includes plural pixel sensor cells, wherein each pixel sensor cell includes three stacked photodiodes. A bottom photodiode is fabricated on the silicon substrate, for sensing light of a longest wavelength. A middle photodiode is fabricated on the silicon substrate, for sensing light of a medium wavelength, and is stacked above the bottom photodiode. A top photodiode is fabricated on the top silicon layer, for sensing light of a shorter wavelength, and is stacked above the middle and bottom photodiodes. Pixel transistors are fabricated on the top silicon layer and are associated with each of the photodiodes by electrical connections which extend between each of the photodiodes and respective pixel transistor(s). The pixel transistors for each pixel sensor cell comprise a pixel transistor set. CMOS circuitry is fabricated adjacent to the sensor array and electrically connected to the array.

A method of fabricating a stacked photodiode sensor array on a silicon-on-oxide (SOI) wafer includes preparing a handle wafer, comprising: preparing a p-type bulk silicon wafer; implanting and activating a first ion into the p-type silicon layer to form a first N+ layer for a bottom photodiode cathode; implanting and activating a second ion in the p-type silicon layer to form a moderately doped p-type silicon layer on top of the first N+ layer; forming a layer of p-type epitaxial silicon on the p-type silicon layer and N+ cathode; implanting and activating a third ion into the p-type epitaxial silicon layer to form a N+ layer for a middle photodiode cathode; implanting and activating a fourth ion into the p-type epitaxial silicon layer to form a N+ surface layer for a cathode contact for the bottom photodiode; preparing a donor wafer, comprising: preparing a silicon donor wafer; thermally oxidizing the silicon donor wafer to form an oxide layer thereon; implanting ions to create a defect plane; preparing the surfaces of the donor wafer and the handle wafer for bonding; bonding the handle wafer and the donor wafer to form a combined wafer; curing the combined wafer; splitting the combined wafer, leaving a top silicon layer on the handle wafer from the donor wafer and burying the oxide layer thereunder as a buried oxide layer, thus forming a silicon-on-oxide structure; annealing the handle wafer to enhance bonding energy; forming an N+P junction in the top silicon layer to form a N+ top photodiode cathode; forming and grounding a P+ region in the top photodiode anode; opening the buried oxide layer to the N+ cathode of the middle photodiode and the bottom photodiode; fabricating pixel transistors on the top silicon layer for each photodiode; and fabricating a CMOS peripheral circuit adjacent to the stacked photodiode sensor array.

It is an object of the invention to provide a stacked photodiode fabricated on an SOI wafer.

Another object of the invention is to provide a process wherein individual diodes may independently be tuned.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIGS. 8-14 depict steps in the method of the invention of fabricating a triple stacked photodiode according to the method of the invention.

DETAILED DESCRIPTION OF THE PREFERRED EMBODIMENTS

Figure 1:
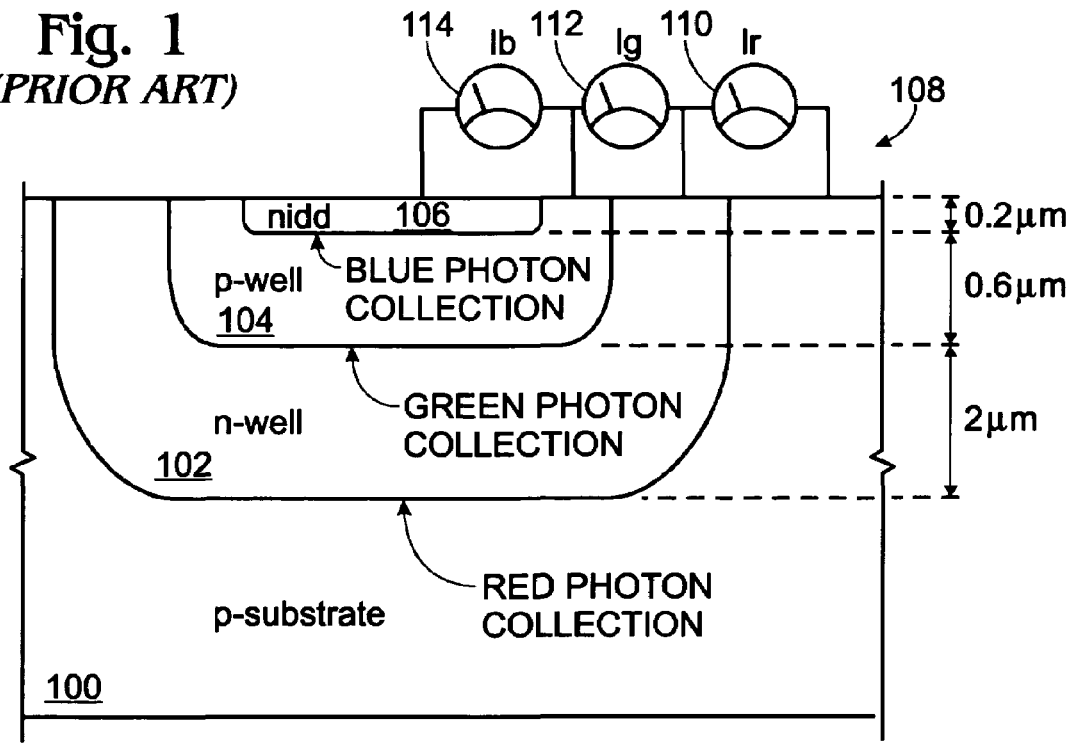
FIG. 1 depicts a prior art stacked RGB photodiode sensor.
Figure 2:
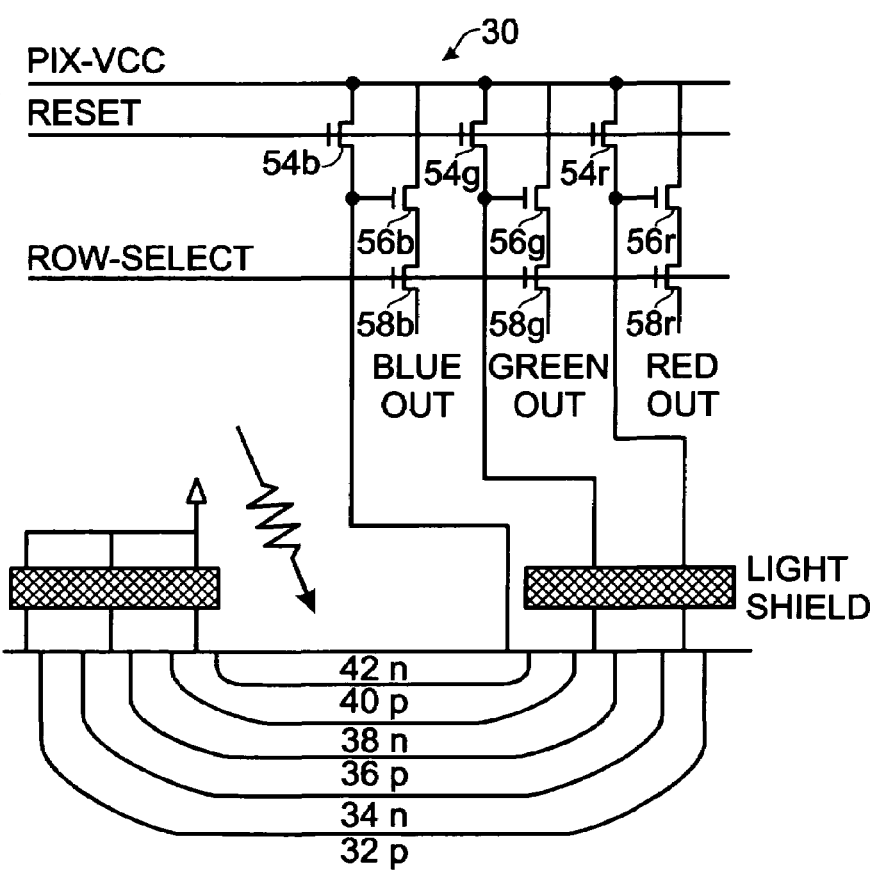
FIG. 2 depicts another embodiment of a prior art stacked RGB photodiode sensor.
Figure 3:
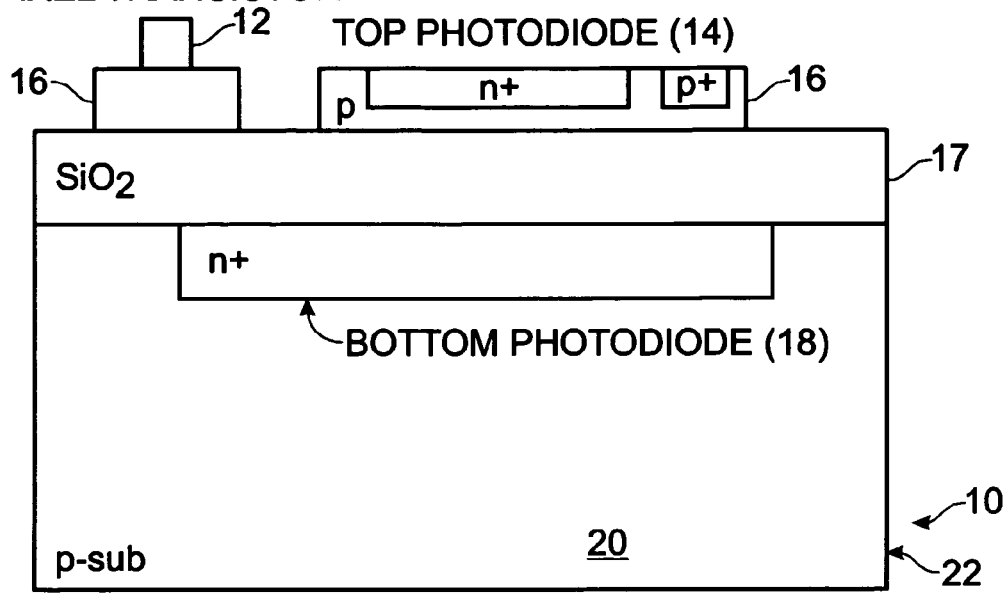
FIGS. 3 and 4 depict two and three stacked RGB photodiode sensors, respectively.

The method of the invention includes fabrication of stacked photodiodes on a silicon-on-insulator (SOI) wafer. Such photodiodes are useful for color sensing and, when three photodiodes are stacked and properly configured, do not require use of color filters. Pixel transistors may be fabricated on the top silicon layer and require only simple electrical isolation from the photodiodes. Thus, the imager sensors have the combined benefits of stacked photodiodes and small pixel size. In the case of double-stacked photodiode imager sensor cell, shown generally at 10 in FIG. 3, also referred to herein as a pixel sensor cell, pixel transistor(s) 12 and one photodiode (blue light sensing) 14 are fabricated on the top silicon layer 16, which is formed on an oxide layer 17, and another photodiode 18 is fabricated on a bulk silicon substrate 20 on a SOI wafer 22. The top photodiode, also referred to herein as a second photodiode, absorbs light having shorter (blue) wavelengths, whereas the bottom photodiode, also referred to herein as a first photodiode, absorbs light having longer (green and red) wavelengths.

Figure 4:
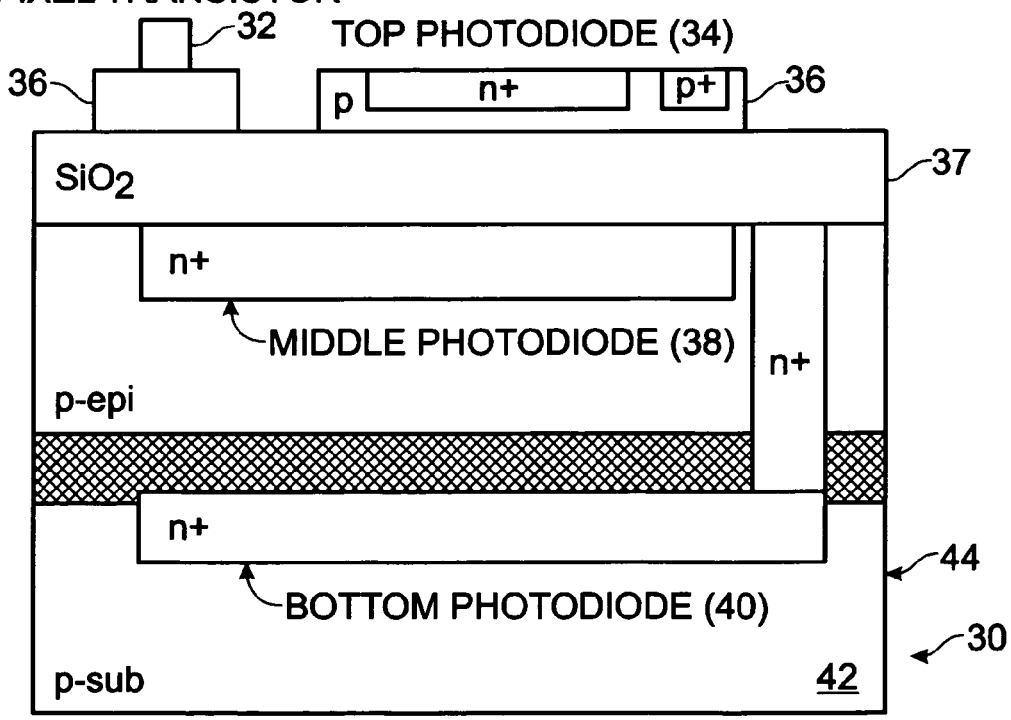

In the case of a triple-stacked photodiode imager sensor cell, shown generally at 30 in FIG. 4, pixel transistor(s) 32 and one photodiode, or photodetector, 34 are fabricated on a top silicon layer 36, which is formed on an oxide layer 37, while the other photodiodes, or photodetectors, 38, 40 are fabricated on a bulk silicon substrate 42 of a SOI wafer 44. Top photodiode 34, fabricated on top silicon layer 36, is used for blue light detection, e.g., a wavelength range between about 350 nm to 500 nm; middle photodiode 38, fabricated on silicon substrate 42, is used for green light detection, e.g., a wavelength range between about 500 nm to 600 nm; and bottom photodiode 40, fabricated on silicon substrate 42, is used for red light detection, e.g., a wavelength range between about 600 nm to 750 nm.

Figure 5:
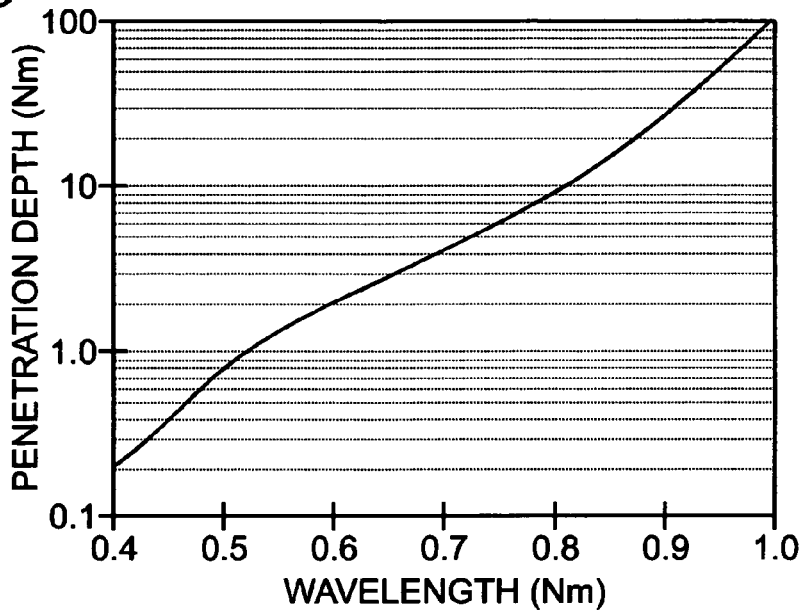
FIG. 5 is a graph of light penetration depth in silicon as a function of light wavelength.

Referring to FIG. 5, the penetration depth of light of various wavelengths in silicon is depicted. Visible light in the blue color spectra penetrates between about 0.2 um to 0.5 um; green light penetrates between about 0.5 µm to 1.5 µm; and red light penetrates between about 1.5 µm to 6.0 µm. Generally, the longer the wavelength, the deeper penetration of light into silicon, thus, at 650 nm, the penetration depth is 3 µm; at 550 nm, the penetration depth is 1.3 µm; and at 450 nm, the penetration depth is 0.4 µm.

The advantages of using SOI wafers for stacked photodiodes are (1) the photodiodes in a silicon handle wafer may be fabricated prior to the wafer bonding process, therefore, the process conditions are much easier to control; (2) the photodiodes may be tuned independently in the handle wafer, which is not restricted by the requirement for pixel transistor fabrication; (3) the photodiode in the silicon handle wafer may have a deep depletion layer, so the quantum efficiency may be high; and (4) pixel transistors may be fabricated on a top silicon layer, facilitating isolation between the individual pixel transistors and between the pixel transistors and the photodiodes. It will be appreciated that the method of the invention does not intend to cover the well known, prior art details of the diode structures and fabrication steps thereof.

The method of the invention is intended to provide an efficient method of using SOI wafers for imager applications.

Figure 6:
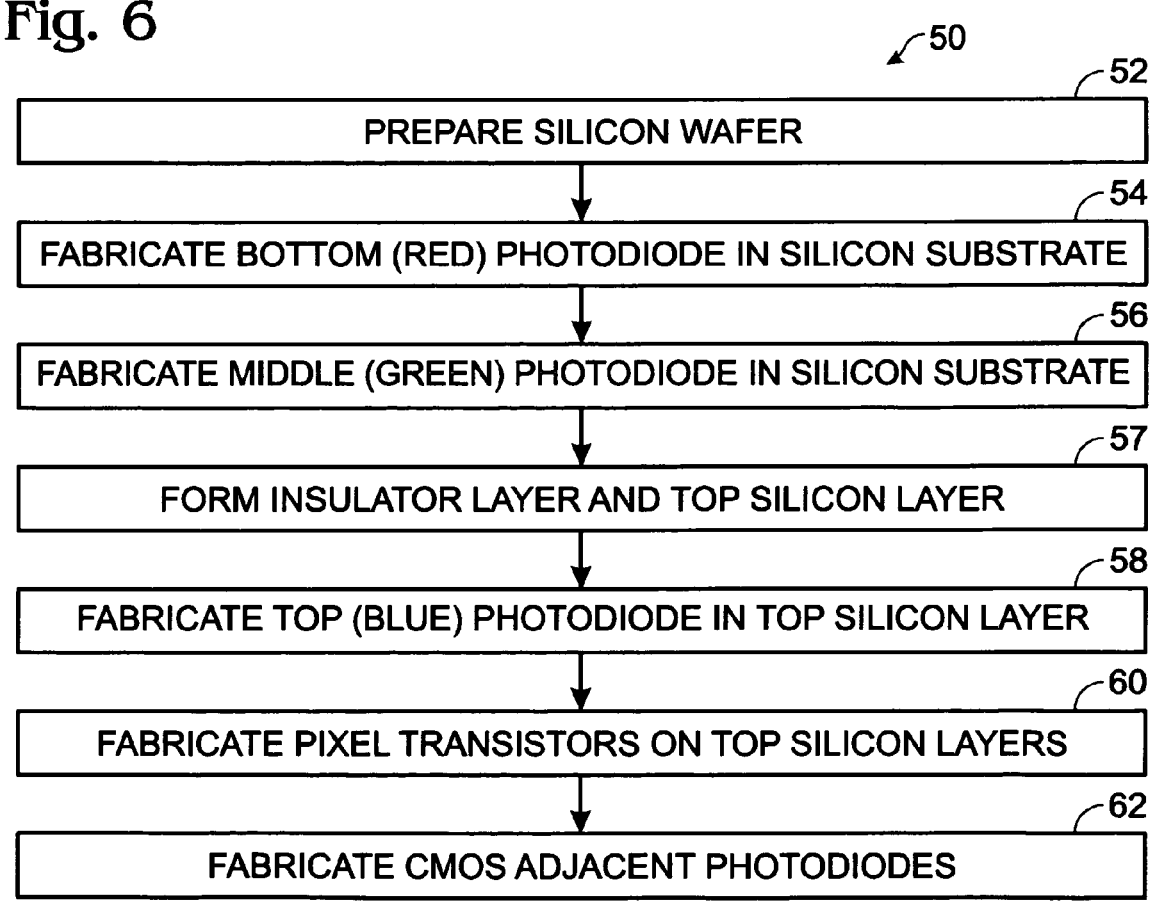
FIG. 6 is a block diagram of the basic method of the invention.

Referring now to FIG. 6, a brief description of the method of the invention 50 follows: A silicon wafer is prepared, 52. A bottom photodetector, to sense red light wavelengths, is fabricated, 54. A middle photodetector, to sense green light wavelengths, is fabricated, 56. An insulator layer and a top silicon layer are formed, 57. A top photodetector, to sense blue light wavelengths, is fabricated, 58. Pixel transistors are fabricated 60 on the top silicon layer, 60. CMOS peripheral circuits are then fabricated, 62. It will be appreciated that the individual steps of forming the top photodetector, the pixel transistors and the CMOS peripheral control circuits may be combined.

Now referring to FIG. 7, which depicts a more detailed method of the invention in block diagram format, generally at 70, and to FIGS. 8-15, the method of the invention is described in connection with fabrication of a CMOS active pixel sensor having a triple-stacked photodiode pixel sensor cell. An array of pixel sensor cells is fabricated for incorporation into a photosensor device, such as a CMOS image sensor.

Figure 7A:
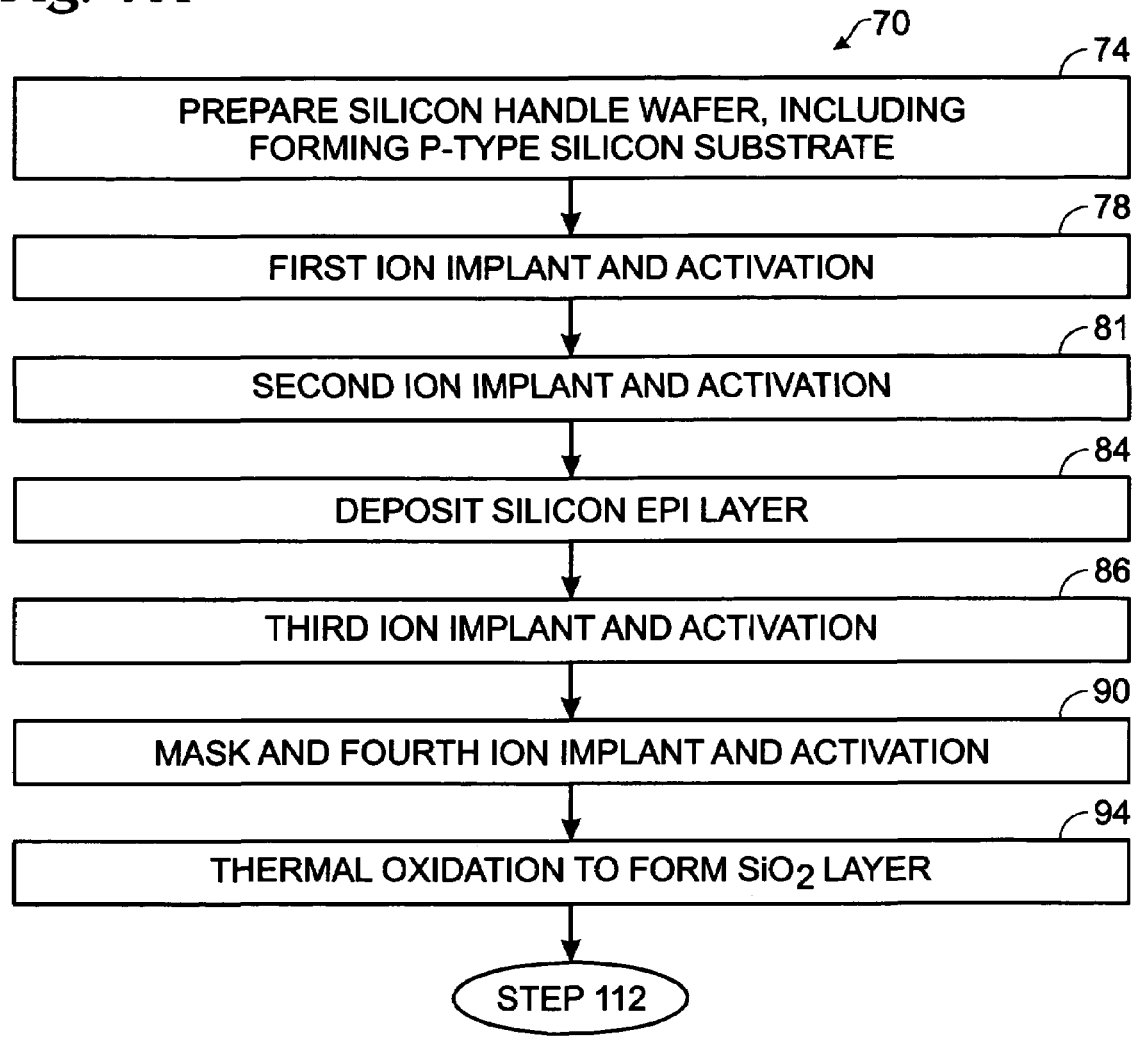
FIG. 7 is a block diagram of a detailed method of the invention.
Figure 8:
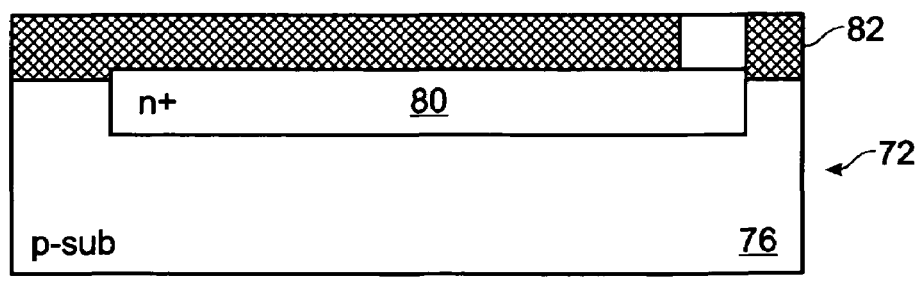
Figure 7B:
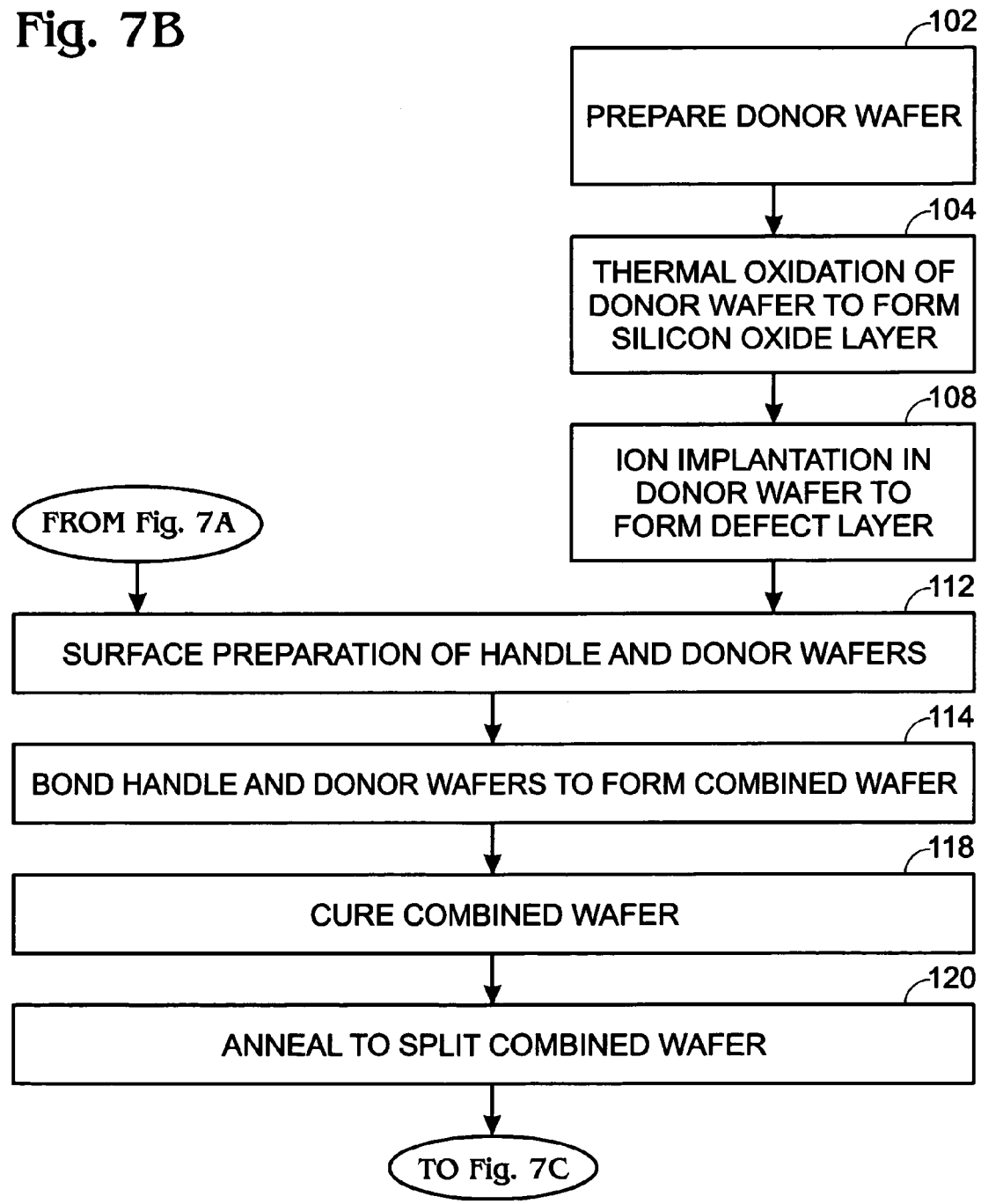

Referring initially to FIGS. 7 and 8, fabrication of a single sensor cell of a sensor array is described. A silicon handle wafer 72 is prepared, step 74, on a bulk silicon substrate 76, which has a boron dopant density of between $1\times10^{14}$ cm$^{-3}$ to $2\times10^{15}$ cm$^{-3}$, forming a p-type substrate. A first N+ ion implantation and activation, step 78, is performed to form the first N+ diode cathode 80. The implantation species, or the first ion, may be arsenic or phosphorous and the dopant density is between $1\times10^6$ cm$^{-3}$ to $1\times10^{20}$ cm$^{-3}$. Ion activation may take place immediately following ion implantation, or ion activation step(s) may take place for multiple ion implantation steps during the fabrication process.

A second ion implantation and activation, step 81, provides a moderately doped p-type layer 82 on top of the first N+ diode cathode 80. The second implantation species is boron and the dopant density is between about $1\times10^{16}$ cm$^{-3}$ to $5\times10^8$ cm$^{-3}$. The first PN (bottom) diode includes first N+ cathode 80, moderately doped p-type layer 82, and p-type substrate 76. A depletion layer is located between N+ cathode 80 and moderately doped p-type layer 82, and between N+ cathode 80 and p-type substrate 76. Because the p-type substrate dopant density is smaller than that of the moderately doped p-type, the majority of the depletion layer of the first PN diode is located between first N+ cathode 80 and p-type silicon substrate 76, and has a thickness of between about 0.5 μm to 5 μm. When the sensor array is completed, the combined thickness of the silicon layers above first N+ cathode 80 is about 1.5 μm. The depletion layer of the first PN diode is operable to absorb light of a wavelength between about 600 nm to 750 nm, i.e., red light. Absorption of light by photodiode results in the generation of an electrical signal by the photodiode, which signal is further manipulated, along with those signals generated by other photodiodes in an array of photodiodes, to produce a visual representation of the image captured by the photodiodes.

As shown in FIG. 9, a layer of silicon 83 is formed by a silicon epitaxial process, step 84, preferably a p-type silicon epitaxial layer having a the boron dopant density in the epi silicon layer of less than $2\times10^{15}$ cm$^{-3}$. The target thickness of the silicon epitaxial layer is about 1.2 μm, and should be in a range of between about 0.8 μm to 3 μm.

Figure 10:
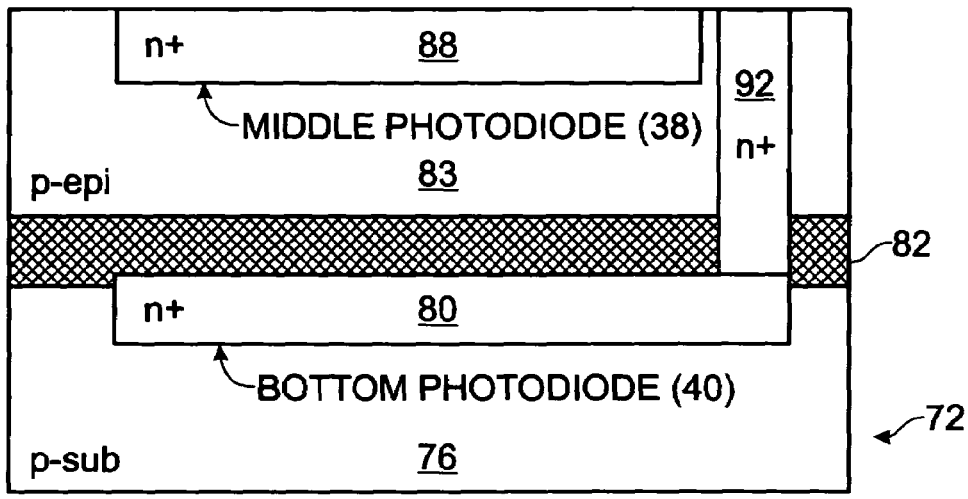

Turning to FIG. 10, a third N+ ion implantation and activation, step 86, is performed to form a middle diode cathode 88. The implantation species may be arsenic or phosphorous, and the dopant density is between about $1\times10^{16}$ cm$^{-3}$ to $1\times10^{20}$ cm$^{-3}$. A masking and fourth N+ ion implantation and activation, step 90, for bottom diode cathode 80 pickup is then performed, which likely requires multiple energy ion implantations to form a deep N+ layer 92. As the dopant density in epi-silicon layer 83 is less than $2\times10^{15}$ cm$^{-3}$, the depletion layer thickness of the middle diode has the thickness of the epi-silicon layer less the thickness of the middle cathode, i.e. a depletion layer thickness of between about 0.6 μm to 2.5 μm, with an optimal thickness of about 1 μm, which, when the sensor cell is completed, is operable to absorb light of a wavelength of between about 500 nm to 600 nm, i.e., green light. Layer 82 prevents punch-through of the first PN diode (bottom, red sensing) and the second PN diode (middle, green sensing).

Figure 11:
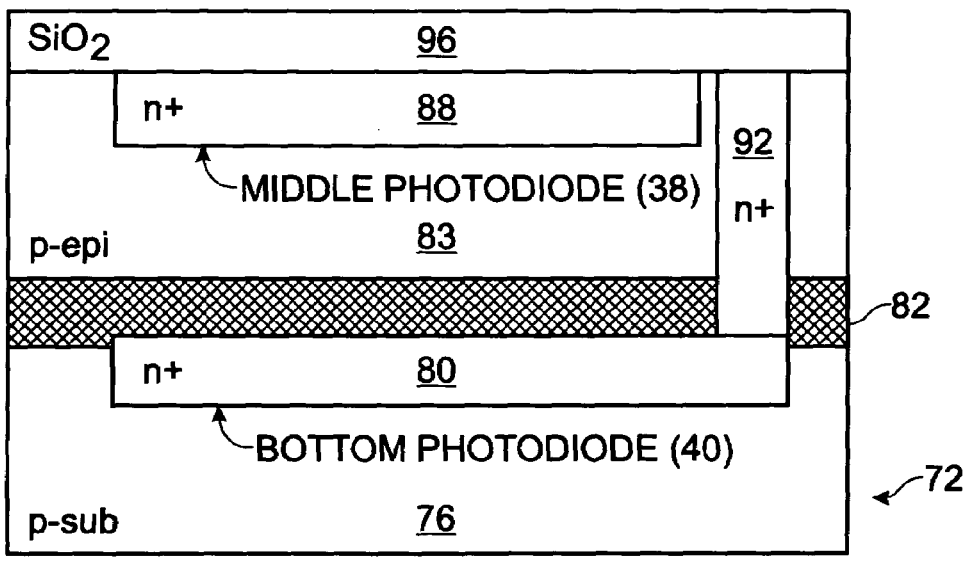

FIG. 11 depicts the results of a thermal oxidation, step 94, of the wafer, resulting in formation of a silicon oxide layer 96, to a thickness of between about 20 nm to 50 nm. This step may be performed after completion of the bottom and middle photodiodes, or after deposition of epi-silicon layer 83, which occurs after fabrication of the bottom photodiode and before fabrication of the middle photodiode.

Figure 12:
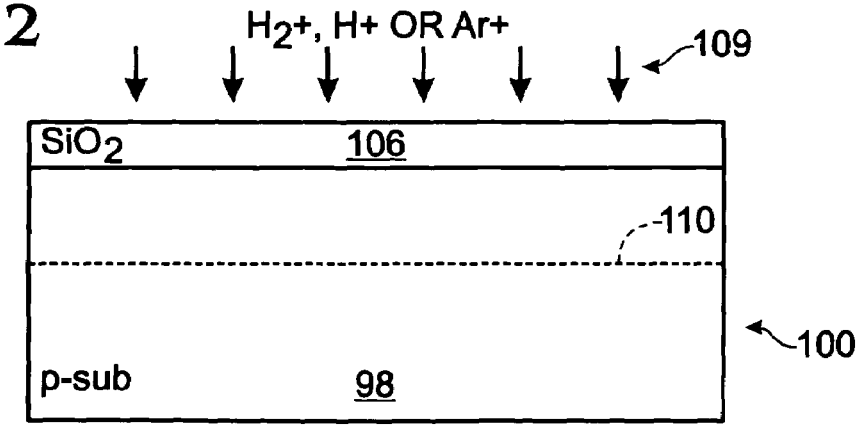

Referring now to FIGS. 7 and 12, a p-type silicon substrate 98 of a donor wafer 100 is prepared, step 102. Thermal oxidation, step 104, of donor wafer 100 to form a silicon oxide layer 106 is performed. Splitting ion implantation, step 108, of $H_2+$, $H+$, $Ar+$, $He+$ or $Ne+$ ions 109 into donor wafer 100 creates a defect plane 110, which is located between about 0.3 μm to 1 μm below the Si/SiO$_2$ interface. The ions are implanted at a dose of between about $5\times10^{15}$ cm$^{-2}$ to $5\times10^{16}$ cm$^{-2}$.

Figure 13:
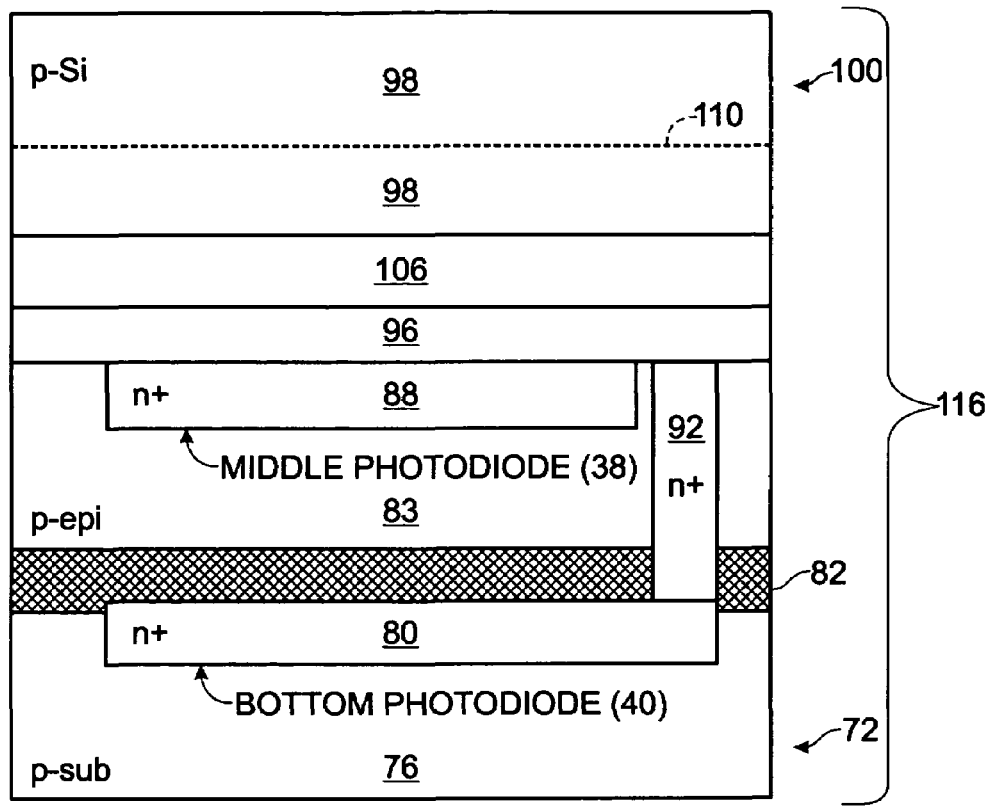

A wafer bonding process is shown in FIG. 13, and includes surface preparation, step 112, of donor wafer 100 and handle wafer 72. Once the wafers are prepared, they are brought into close proximity, whereupon bonding, step 114, occurs spontaneously, to form a combined wafer 116. The bonded pair combined wafer is cured, step 118, in an oven to improve the bonding energy.

Figure 14:
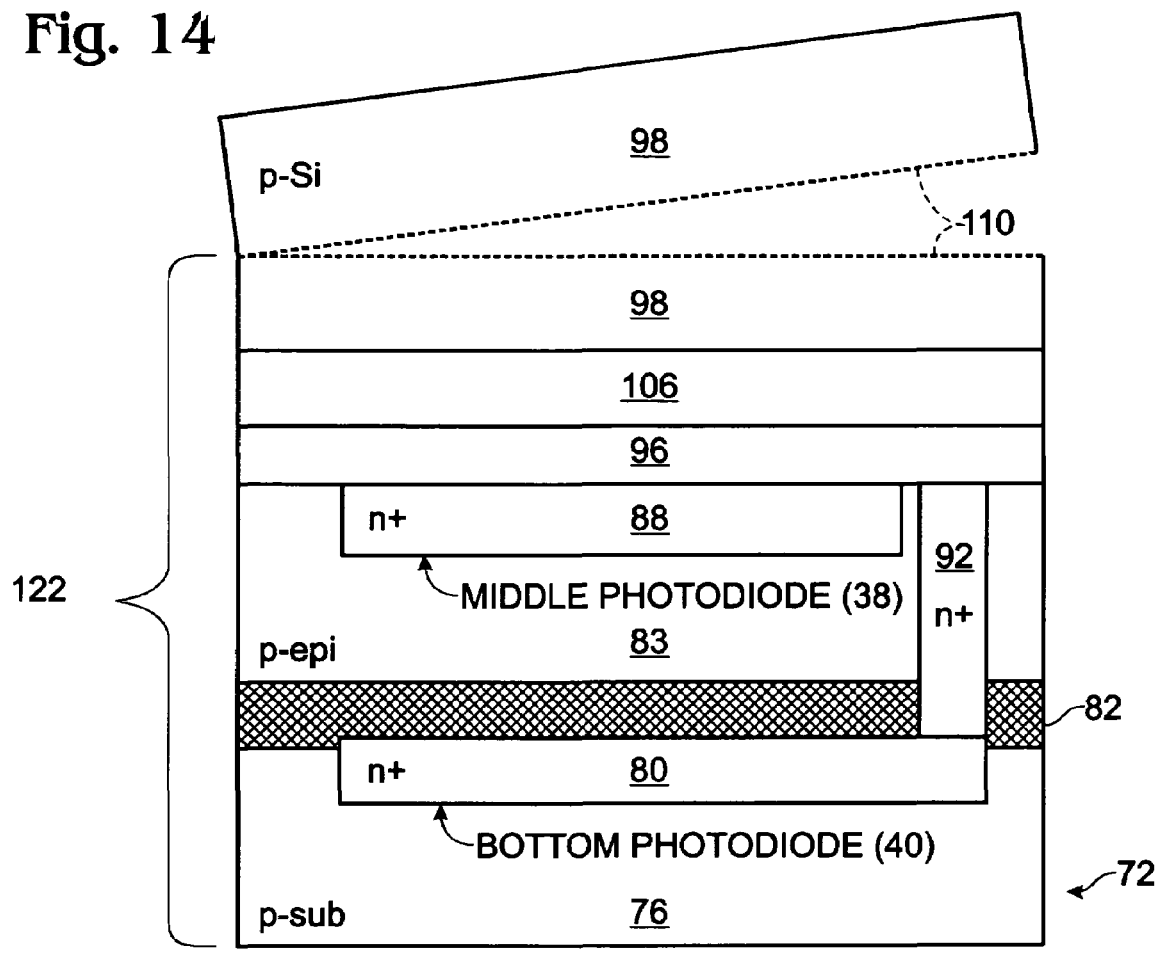

A splitting step, 120, is depicted in FIG. 14, wherein the combined wafer is split along the defect plane by annealing in a furnace at a temperature of between about 350° C. to 800° C. The split results in a SOI wafer 122, wherein a portion of silicon layer 98 is located on SiO$_2$ layer 106, or combined SiO$_2$ layer 96/106. SOI wafer 122 is then annealed, step 124, to improve the bonding energy. Surface preparation, step 126, of the split wafer includes chemical mechanical polishing (CMP), dry etching, and wet etching to clean and condition the wafer surface layer for device fabrication, resulting in a final thickness of top silicon layer 98 of between about 0.1 μm to 0.5 μm.

Figure 15:
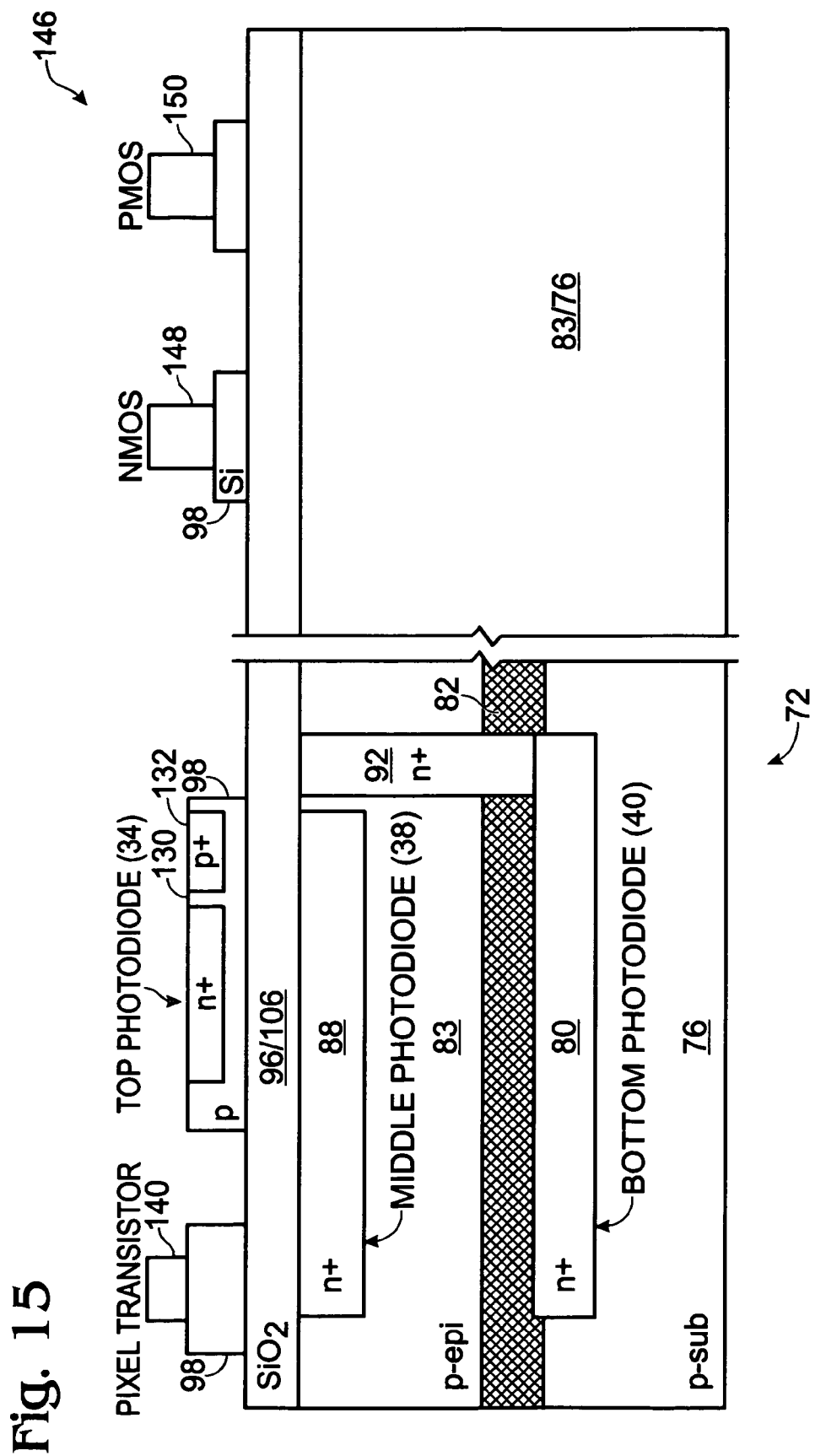
FIG. 15 depicts a photodiode sensor cell of the invention wherein a CMOS control circuit is fabricated on a top silicon layer.

Referring now to FIG. 15, formation, step 128, of a N+P junction 130 on top silicon layer 98, has a thickness of between about 0.1 μm to 0.5 μm. A P+ region 132 on the top photodiode is formed and grounded, step 134, either by connection to the silicon substrate or to the top of wafer with metal wiring. Buried oxide insulator layer 96/106 of SOI wafer 122 is opened, step 136, to N+ cathode 88 of the middle photodiode and pickup 92 of bottom photodiode cathode 80. Next, fabrication, step 138, of a pixel transistor set 140, for controlling each pixel sensor cell, on top silicon layer 98 is performed. Each photodiode requires between one and four pixel transistors. As there are three photodiodes in each pixel sensor cell, between three and 12 pixel transistors are required for each pixel sensor cell, which pixel transistors are referred to herein collectively as a pixel transistor set, and which are represented by reference number 140.

CMOS control circuits may be fabricated adjacent the pixel sensor cell array on (1) top silicon layer 98; (2) on a reduced-thickness top silicon layer; and (3) on bulk silicon. In FIG. 15, CMOS control circuitry is fabricated on a reduced thickness top silicon layer. Top silicon layer 98, in the region where the CMOS peripheral circuit is to be fabricated, may be reduced, step 142, to a thickness of between about 20 nm to 200 nm. Then CMOS peripheral circuits may be fabricated, step 144. As shown, CMOS control circuit 146, including NMOS 148 and PMOS 150, is fabricated on top silicon layer 98. In practice, fabrication of the pixel transistor sets, peripheral CMOS control circuitry and top photodiode 34 likely share process steps. The same processes are used should CMOS circuitry be desired to be fabricated on a full thickness top silicon layer.

Figure 16:
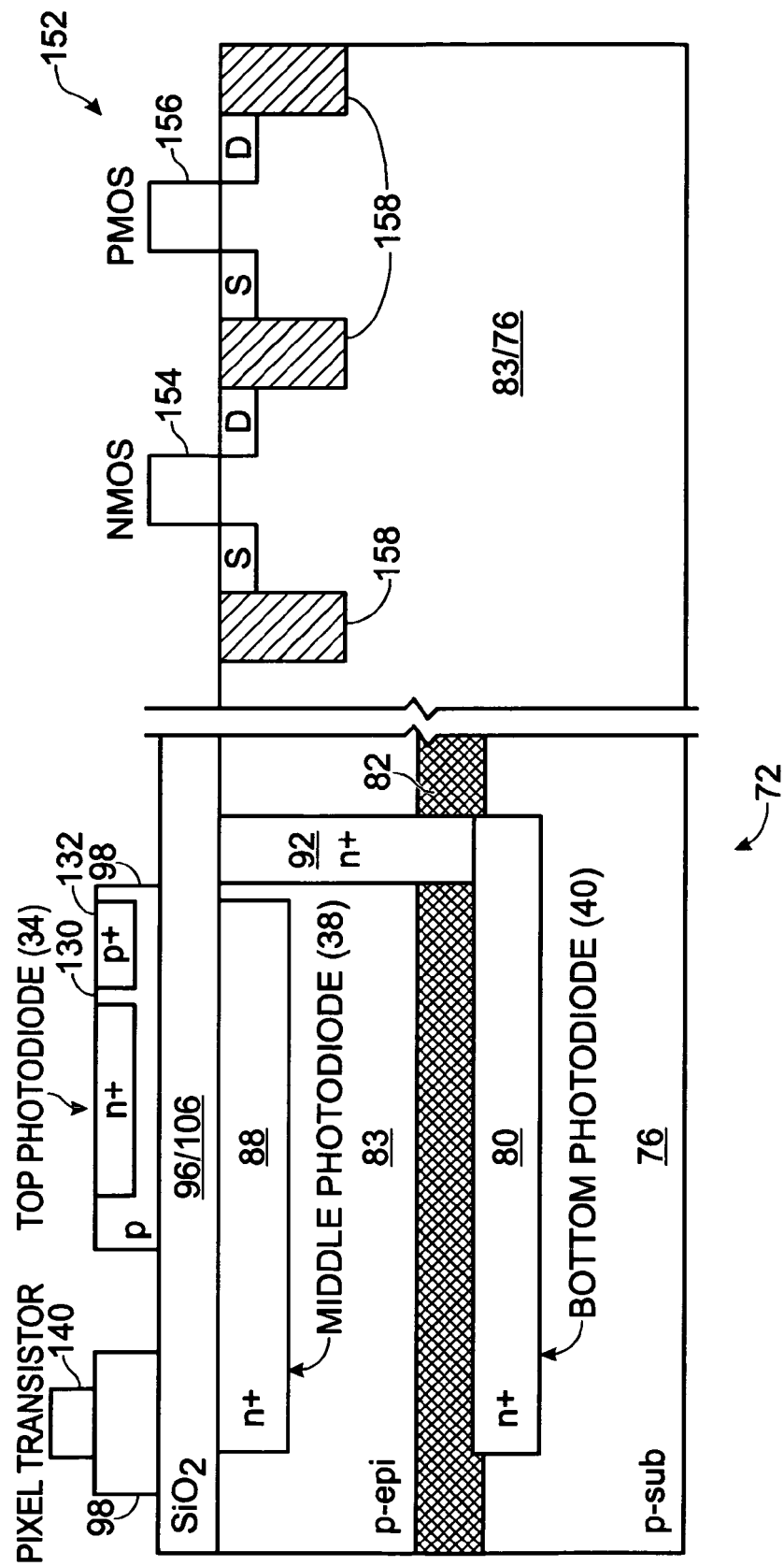
FIG. 16 depicts a photodiode sensor cell of the invention wherein a CMOS control circuit is fabricated on a bottom (bulk) silicon layer.

The CMOS peripheral circuit may also be fabricated on the bulk silicon wafer, as depicted in FIG. 16, wherein the exposed top silicon layer and the buried oxide part of the SOI wafer are removed, step 142, so that peripheral CMOS control circuit 152, including NMOS 154 and PMOS 156, may be fabricated on the bulk silicon, which includes silicon substrate 76 and epi-silicon layer 83. Again, fabrication of the pixel transistor, sets, peripheral CMOS control circuitry and top photodiode 34 likely share process steps. CMOS circuitry is provided for a variety of functions, such as timing, exposure control, color processing, and image enhancement and compression, to name a few. In the case of a CMOS image sensor for use in a ten megapixel camera, an array of ten million pixel sensor cells is fabricated.

Figure 17:
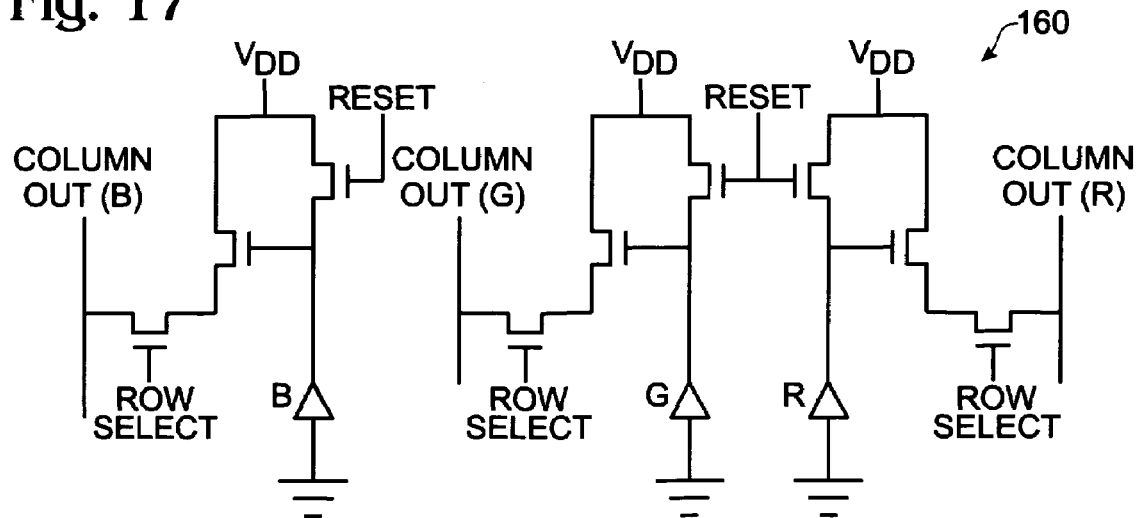
FIG. 17 depicts an active pixel sensor cell having nine pixel transistors within a unit cell constructed according to the method of the invention.
Figure 18:
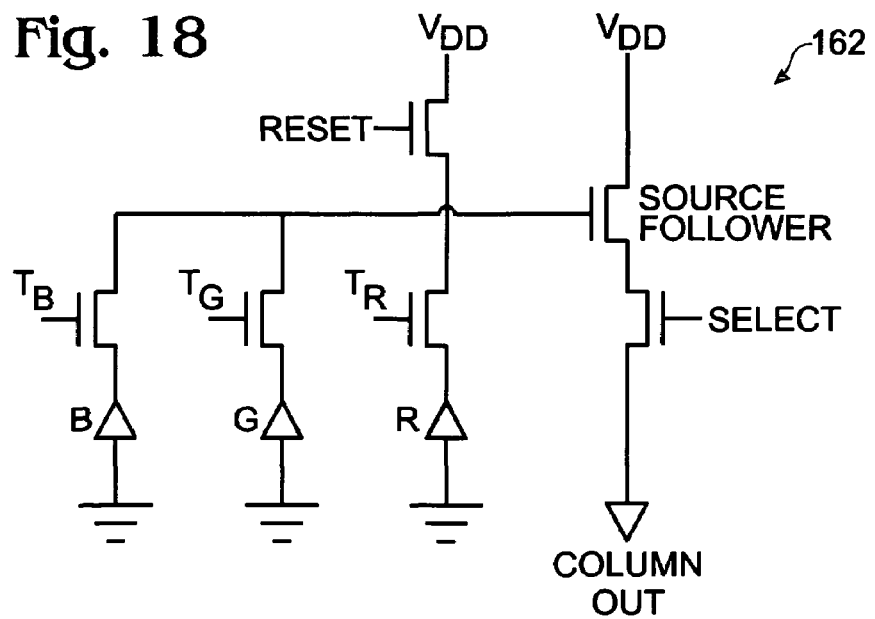
FIG. 18 depicts an active pixel sensor cell having six pixel transistors within a unit cell constructed according to the method of the invention.

Circuits for the triple-stacked photodiode active pixel sensor cells may be of a nine transistor (9T) unit cell type, or of a six-transistor (6T) unit cell type, as shown in FIGS. 17 and 18, generally at 160, 162, respectively. In FIG. 17, R indicates the red color sensing diode; G represents the green color sensing diode, and B represents the blue color sensing diode. The 6T unit cell of FIG. 18 includes a transfer transistor for blue color sensing diode, $T_B$, a transfer transistor for green color sensing diode, $T_G$, and a transfer transistor for red color sensing diode, $T_R$. Other circuits may also be used to sense the photosignal of the triple stacked photodiode imager.

Figure 19:
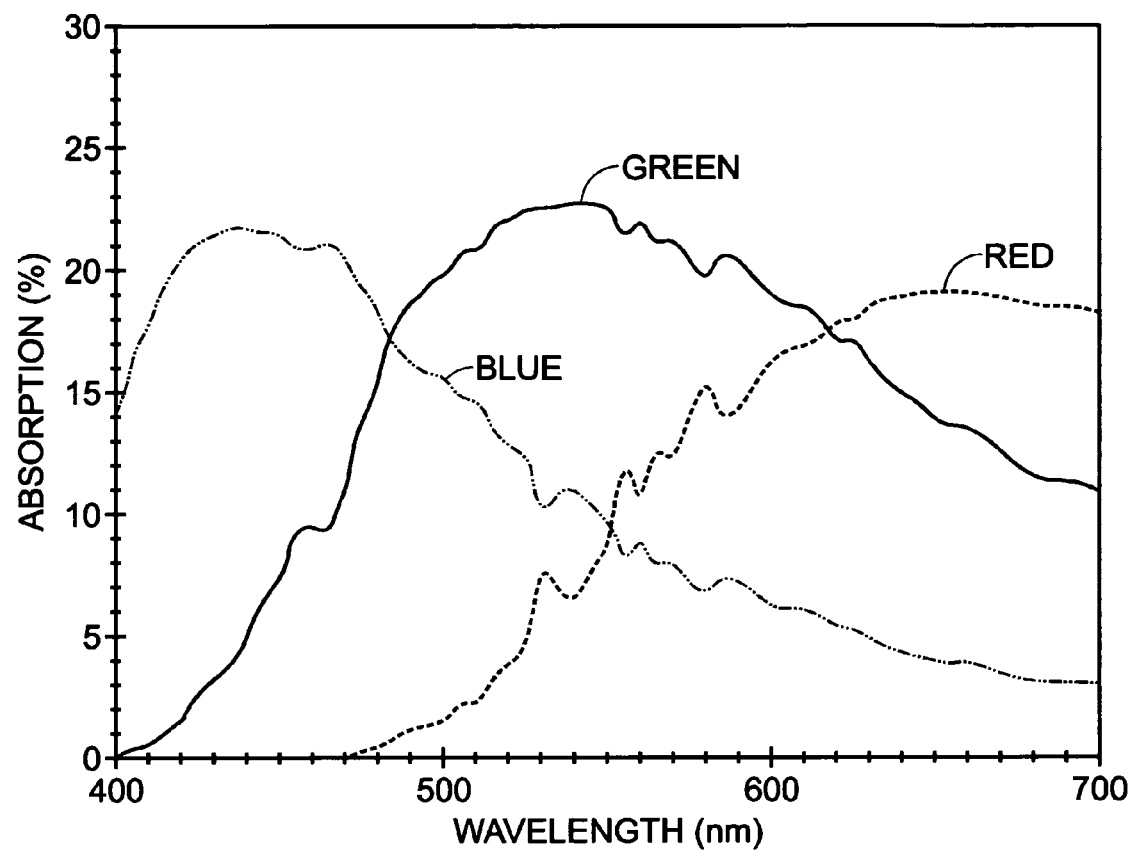
FIG. 19 depicts a simulation of light absorbing characteristics of a RGB photodiode sensor constructed according to the method of the invention.

FIG. 19 depicts simulation of light absorption in the three diodes is shown on the left. The thicknesses for the layers are as follows: blue cathode layer, about 0.1 μm; top silicon layer, about 0.3 μm; buried oxide layer, 0.2 μm; green cathode layer, about 0.2 μm, silicon epitaxial layer, about 1.1 μm, red cathode layer, about 0.5 μm, and the red absorption layer, about 2.5 μm. Three colors may easily be distinguished by the three stacked junctions. The dopant densities and doses recited herein are deemed critical parameters to provide proper penetration of light and absorption of a specific light wavelength by each photodiode in the stack.

As shown in the drawings and as described in this Specification, the description includes all steps of the best mode of practicing the invention.

Thus, a method of fabricating a stacked RGB photo diode on a SOI wafer has been disclosed. It will be appreciated that further variations and modifications thereof may be made within the scope of the invention as defined in the appended claims.

We claim:

1. A method of fabricating a stacked photodiode on a silicon-on-oxide (SOI) wafer, comprising:
    preparing a handle wafer, comprising:
    preparing a p-type bulk silicon wafer;
    implanting and activating a first ion into the p-type silicon layer to form a first N+ layer for a bottom photodiode cathode;
    implanting and activating a second ion into the p-type silicon layer on top of the first N+ layer to form a moderately doped p-layer;
    forming a layer of p-type epitaxial silicon on the p-type silicon layer and N+ cathode;
    implanting and activating a third ion into the p-type epitaxial silicon layer to form a N+ layer for a middle photodiode cathode;
    implanting and activating a fourth ion into the p-type epitaxial silicon layer to form a N+ surface layer for a cathode contact for the bottom photodiode;
    preparing a donor wafer, comprising:
    preparing a silicon donor wafer;
    thermally oxidizing the silicon donor wafer to form an oxide layer thereon;
    implanting ions to create a defect plane;
    preparing the surfaces of the donor wafer and the handle wafer for bonding;
    bonding the handle wafer and the donor wafer to form a combined wafer;
    curing the combined wafer;
    splitting the combined wafer, leaving a top silicon layer on the handle wafer from the donor wafer and burying the oxide layer thereunder as a buried oxide layer, thus forming a silicon-on-oxide structure;
    annealing the handle wafer to enhance bonding energy;
    forming an N+P junction in the top silicon layer to form a top photodiode cathode;
    forming and grounding a P+ region in the top silicon layer to form a top photodiode anode;
    opening the buried oxide layer to the N+ cathode of the middle photodiode and the bottom photodiode;
    fabricating pixel transistor(s) on the top silicon layer for each photodiode; and
    fabricating a CMOS peripheral control circuit.

2. The method of claim 1 wherein said fabricating a CMOS peripheral control circuit includes fabricating a CMOS peripheral control circuit on the top silicon layer.

3. The method of claim 2 wherein said fabricating a CMOS peripheral control circuit on the top silicon layer includes thinning the top silicon layer before said fabricating a CMOS peripheral control circuit.

4. The method of claim 1 wherein said fabricating a CMOS peripheral control circuit includes fabricating the CMOS peripheral control circuit on bulk silicon.

5. The method of claim 4 wherein, said fabricating a CMOS peripheral control circuit includes removing the top silicon layer and buried oxide layer, and fabricating the CMOS peripheral control circuit on bulk silicon.

6. The method of claim 1 wherein said implanting and activating a first and third ion into the p-type silicon layer to form a N+ layer includes implanting arsenic or phosphorus ions to a density of between about $1 \times 10^{16}$ cm$^{-3}$ to $1 \times 10^{20}$ cm$^{-3}$.

7. The method of claim 1 wherein said implanting and activating a second ion into the p-type silicon layer includes implanting boron ions to form a moderately doped p-type layer having a doping density of between about $1 \times 10^{16}$ cm$^{-3}$ to $5 \times 10^{18}$ cm$^{-3}$.

8. The method of claim 1 wherein said implanting ions in the donor wafer to create a defect plane includes implanting ions taken from the group of ions consisting of $H_2+$, H+, Ar+, He+ or Ne+ ions to a depth of between about 0.3 μm to 1 μm below the Si/SiO$_2$ interface, at a dose density of between about $5 \times 10^{15}$ cm$^{-2}$ to $5 \times 10^{16}$ cm$^{-2}$.

9. The method of claim 8 wherein said implanting and activating a first and third ion into the p-type silicon layer to form a N+ layer includes implanting arsenic or phosphorus ions to a density of between about $1\times10^{16}$ cm$^{-3}$ to $1\times10^{20}$ cm$^{-3}$.

10. The method of claim 8 wherein said implanting and activating a second ion into the p-type silicon layer includes implanting boron ions to form a moderately doped p-type layer having a doping density of between about $1\times10^{16}$ cm$^{-3}$ to $5\times10^{18}$ cm$^{-3}$.

11. The method of claim 1 wherein the bottom photodiode is sensitive to light having a wavelength of between about 600 nm to 750 nm; the middle photodiode is sensitive to light having a wavelength of between about 500 nm to 600 nm; and the top photodiode is sensitive to light having a wavelength of between about 300 nm to 500 nm.

12. The method of claim 1 which includes forming a layer of thermally grown silicon oxide on the handle wafer.

13. A method of fabricating a stacked photodiode on a silicon-on-oxide (SOI) wafer, comprising:
    preparing a handle wafer, comprising:
    preparing a bulk silicon wafer, preparing a bulk silicon wafer, of a p-type having a boron doping density of between about $1\times10^{14}$ to $2\times10^{15}$;
    implanting and activating a first ion into the p-type silicon layer to form a N+ layer for a bottom photodiode cathode;
    implanting and activating a second ion into the p-type silicon layer on top of the first N+ layer to form a moderately doped p-layer;
    forming a layer of p-type epitaxial silicon on the p-type silicon layer and N+ cathode;
    implanting and activating a third ion into the p-type epitaxial silicon layer to form a N+ layer for a middle photodiode cathode;
    implanting and activating a fourth ion into the p-type epitaxial silicon layer to form a N+ surface layer for a cathode contact for the bottom photodiode;
    preparing a donor wafer, comprising:
    preparing a silicon donor wafer;
    thermally oxidizing the silicon donor wafer to form an oxide layer thereon;
    implanting ions to create a defect plane;
    preparing the surfaces of the donor wafer and the handle wafer for bonding;
    bonding the handle wafer and the donor wafer to form a combined wafer;
    curing the combined wafer;
    splitting the combined wafer, leaving a top silicon layer on the handle wafer from the donor wafer and burying the oxide layer thereunder as a buried oxide layer, thus forming a silicon-on-oxide structure;
    annealing the handle wafer to enhance bonding energy;
    forming an N+P junction in the top silicon layer to form a top photodiode cathode;
    forming and grounding a P+ region in the top silicon layer to form a top photodiode anode;
    opening the buried oxide layer to the N+ cathode of the middle photodiode and the bottom photodiode;
    fabricating pixel transistor(s) on the top silicon layer for each photodiode;
    removing the exposed top silicon layer and buried oxide layer; and
    fabricating CMOS peripheral circuits on the bulk silicon substrate.

14. The method of claim 13 wherein said implanting ions in the donor wafer to create a defect plane includes implanting ions taken from the group of ions consisting of $H_2+$, $H+$, $Ar+$, $He+$ or $Ne+$ ions to a depth of between about 0.3 μm to 1 μm below the Si/SiO$_2$ interface, at a dose density of between about $5\times10^{15}$ cm$^{-2}$ to $5\times10^{16}$ cm$^{-2}$.

15. The method of claim 13 wherein the bottom photodiode is sensitive to light having a wavelength of between about 600 nm to 750 nm; the middle photodiode is sensitive to light having a wavelength of between about 500 nm to 600 nm; and the top photodiode is sensitive to light having a wavelength of between about 300 nm to 500 nm.

16. The method of claim 13 which includes forming a layer of thermally grown silicon oxide on the handle wafer.

17. A method of fabricating a stacked photodiode on a silicon-on-oxide (SOI) wafer, comprising:
    preparing a handle wafer, comprising:
    preparing a p-type bulk silicon wafer;
    implanting and activating a first ion into the p-type silicon layer to form a N+ layer for a bottom photodiode cathode;
    implanting and activating a second ion into the p-type silicon layer on top of the first N+ layer to form a moderately doped p-layer;
    forming a layer of p-type epitaxial silicon on the p-type silicon layer and N+ cathode;
    implanting and activating a third ion into the p-type epitaxial silicon layer to form a N+ layer for a middle photodiode cathode;
    implanting and activating a fourth ion into the p-type epitaxial silicon layer to form a N+ surface layer for a cathode contact for the bottom photodiode;
    preparing a donor wafer, comprising:
    preparing a silicon donor wafer;
    thermally oxidizing the silicon donor wafer to form an oxide layer thereon;
    implanting ions in the donor wafer to create a defect plane;
    preparing the surfaces of the donor wafer and the handle wafer for bonding;
    bonding the handle wafer and the donor wafer to form a combined wafer;
    curing the combined wafer;
    splitting the combined wafer, leaving a top silicon layer on the handle wafer from the donor wafer and burying the oxide layer thereunder as a buried oxide layer, thus forming a silicon-on-oxide structure;
    annealing the handle wafer to enhance bonding energy;
    forming an N+P junction in the top silicon layer to form a top photodiode cathode;
    forming and grounding a P+ region in the top silicon layer to form a top photodiode anode;
    opening the buried oxide layer to the N+ cathode of the middle photodiode and the bottom photodiode;
    fabricating pixel transistors on the top silicon layer for each photodiode; and
    fabricating CMOS peripheral circuits on the top silicon layer.

18. The method of claim 17 wherein said fabricating a CMOS peripheral control circuit on the top silicon layer includes thinning the top silicon layer before said fabricating a CMOS peripheral control circuit.

19. The method of claim 17 wherein said implanting and activating a first and thirds ion into the p-type silicon layer to form a N+ layer includes implanting arsenic or phosphorus ions to a density of between about $1\times10^{16}$ cm$^{-3}$ to $1\times10^{20}$ cm$^{-3}$.

20. The method of claim 17 wherein said implanting and activating a second ion into the p-type silicon layer includes implanting boron ions to form a moderately doped p-type layer having a doping density of between about $1\times10^{16}$ cm$^{-3}$ to $5\times10^{18}$ cm$^{-3}$.

21. The method of claim 17 wherein said implanting ions in the donor wafer to create a defect plane includes implanting ions taken from the group of ions consisting of $H_2+$, H+, Ar+, He+ or Ne+ ions to a depth of between about 0.3 μm to 1 μm below the $Si/SiO_2$ interface, at a dose density of between about $5 \times 10^{15}$ cm$^{-2}$ to $5 \times 10^{16}$ cm$^{-2}$.

22. The method of claim 17 wherein the bottom photodiode is sensitive to light having a wavelength of between about 600 nm to 750 nm; the middle photodiode is sensitive to light having a wavelength of between about 500 nm to 600 nm; and the top photodiode is sensitive to light having a wavelength of between about 300 nm to 500 nm.

23. The method of claim 17 which includes forming a layer of thermally grown silicon oxide on the handle wafer.

* * * * *